(12) United States Patent
Hayashi et al.

(10) Patent No.: US 7,435,938 B2
(45) Date of Patent: Oct. 14, 2008

(54) OPTICAL PACKET COMMUNICATION DEVICE WITH AN APPLIED NEGATIVE VOLTAGE FOR CANCELING AN OFFSET VOLTAGE

(75) Inventors: Daisuke Hayashi, Musashino (JP); Masayuki Suehiro, Musashino (JP); Hirotoshi Kodaka, Musashino (JP); Yasukazu Akasaka, Musashino (JP); Shinji Iio, Musashino (JP); Morio Wada, Musashino (JP); Toshimasa Umezawa, Musashino (JP); Toshiyasu Izawa, Musashino (JP); Hiroshi Shimizu, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 30 days.

(21) Appl. No.: 11/589,077

(22) Filed: Oct. 30, 2006

(65) Prior Publication Data
US 2007/0164198 A1    Jul. 19, 2007

(30) Foreign Application Priority Data
Oct. 31, 2005    (JP) .............................. 2005-316181

(51) Int. Cl.
*H01J 40/14*    (2006.01)
(52) U.S. Cl. ............................... 250/214 R; 250/214 A

(58) Field of Classification Search ............. 250/214 A, 250/214 R, 214.1; 330/308, 9, 85
See application file for complete search history.

(56) References Cited

U.S. PATENT DOCUMENTS

2002/0020803 A1* 2/2002 Suzuki et al. ............ 250/214 A
2006/0086891 A1* 4/2006 Gottesman et al. ...... 250/214 A

FOREIGN PATENT DOCUMENTS

JP    2004-47822 A    2/2004
JP    2005-62879 A    3/2005

* cited by examiner

*Primary Examiner*—Que T Le
(74) *Attorney, Agent, or Firm*—Westerman, Hattori, Daniels & Adrian, LLP.

(57) ABSTRACT

There is provided a PD-TIA module that can be used for recognition of an address of an optical packet signal in a system having variation in mark rate all the time, such as an optical packet communication system. An optical communication module comprises a photoelectric converter for converting an optical signal into a current signal, a current/voltage conversion means connected to the photoelectric converter, for converting the current signal into a voltage signal, and a limiting amplifier for receiving and amplifying an electric signal subjected to voltage conversion by the current/voltage conversion means while comparing the electric signal as amplified with a predetermined threshold value, thereby outputting a signal for "0" or "1".

2 Claims, 3 Drawing Sheets

OPTICAL PACKET COMMUNICATION DEVICE WITH AN APPLIED NEGATIVE VOLTAGE FOR CANCELING AN OFFSET VOLTAGE

FIELD OF THE INVENTION

The present invention relates to an optical communication module, and more particularly, to an optical communication module suitable for use in detection of an address affixed to the header of an optical packet signal.

BACKGROUND OF THE INVENTION

With the arrival of the age of multimedia including Internet, further advance as well as globalization of service is required of an optical communication network technology for the basic communication system, and rapid progress in development is being made towards the information society. Further, a receive-function having higher performance is required of a receiver of an optical transmission system as progress towards larger capacity/higher speed of the optical communication circuit advances.

FIG. 3 is a circuit block diagram showing the principal parts of a conventional optical communication module. In FIG. 3, a PD 1 has a cathode connected to a power source V1, and an anode connected to an input terminal of a TIA (Trans Impedance Amplifier) 2.

The TIA2 functions as a differential amplifier, having two output terminals connected to input terminals of a limiting amplifier 4 via capacitors 3a, 3b, respectively. Differential outputs from the limiting amplifier 4 are transmitted to a control circuit (not shown) disposed in a subsequent stage via capacitors 3c, 3d, respectively.

In a configuration as described above, an optical signal inputted is converted into an electric signal by the PD1 to be amplified by the TIA2 in a subsequent stage. At this point in time, outputs from the TIA2 are turned into AC outputs. A DB (data buffer) 4 in a subsequent stage functions as the limiting amplifier as well as a comparator, amplifying the AC outputs from the TIA2 to thereby compare the AC outputs as amplified with a predetermined threshold value, and outputting bit "1" when the optical signal is present while outputting bit "0" when no optical signal is present.

The related art having a configuration where outputs from a PD are amplified by use of a TIA is disclosed in the following Patent Document.

[Patent Document 1] JP 2004-47822 A
  JP 2005-62879 A

SUMMARY OF THE INVENTION

With the optical communication module of a conventional configuration shown in FIG. 3, since the output terminals of the TIA2 are AC coupled, respective levels and amplitudes of output signals undergo variation according to a mark rate of the optical signal inputted. Accordingly, if such a device as described is used in a system having variation in mark rate all the time, such as an optical packet communication system, there can occur a case where signals outputted from the DB 4 cause an erroneous operation against the optical signal inputted.

More specifically, if the TIA2 keeps outputting a fast RF signal through AC coupling, this will cause an output level to gradually rise. This is because when an input is at a level of, for example, "1"→"0"→"1", it happens that subsequent bit "1" is outputted before output levels from the capacitors fully falls at the level "0". In such a state, even if the input signal is at "0", it exceeds a level of the threshold value of the DB (data buffer) to thereby output "1", resulting in an erroneous operation.

Consequently, a problem has been encountered in that in the case where a state where the optical signal is not received at all is turned into a state the optical signal is continuously received, it becomes impossible to gradually change levels and amplitudes of output signals from the TIA2 so as to keep an adequate threshold value of the DB 4 for receiving the output signals in the subsequent stage at a fixed value.

Now, if a part where AC coupling is made is simply changed to that for DC coupling, it follows that since the capacitors are no longer available, there will be no variation in the levels of the output signals, dependent on the mark rate, however, as a large current flows to the TIA2, the output signals come to carry a large offset, so that the DB is no longer able to receive the output signals.

It is therefore an object of the invention to provide a PD-TIA module that can be used for recognition of an address of an optical packet signal in a system having variation in mark rate all the time, such as an optical packet communication system.

To that end, in accordance with one aspect of the invention, there is provided an optical communication module comprising a photoelectric converter for converting an optical signal into a current signal, a current/voltage conversion means connected to the photoelectric converter, for converting the current signal into a voltage signal, and a limiting amplifier for receiving and amplifying an electric signal subjected to voltage conversion by the current/voltage conversion means while comparing the electric signal as amplified with a predetermined threshold value, thereby outputting a signal for "0" or "1".

The photoelectric converter and the current/voltage conversion means are preferably electrically insulated from an enclosure.

A negative voltage is preferably applied to the photoelectric converter and the current/voltage conversion means, thereby canceling an offset voltage occurring to an output signal from the current/voltage conversion means.

As is evident from the foregoing description, the present invention has the following advantageous effects. Since the present invention provides in its one aspect the optical communication module comprising a photoelectric converter for converting an optical signal into a current signal, a current/voltage conversion means connected to the photoelectric converter, for converting the current signal into a voltage signal, and a limiting amplifier for receiving and amplifying an electric signal subjected to voltage conversion by the current/voltage conversion means while comparing the electric signal as amplified with a predetermined threshold value, thereby outputting a signal for "0" or "1", it is possible to maintain respective voltage levels and amplitudes of signals outputted from the TIA at a fixed level even if the optical communication module is used in a system having variation in mark rate all the time, such as an optical packet communication system.

Further, with the photoelectric converter and the current/voltage conversion means that are electrically insulated from the enclosure, and with the negative voltage (Vee) applied thereto, the threshold value of the DB can be adequately provided by adjusting the negative voltage –Vee, and excess of an offset can be cancelled.

PREFERRED EMBODIMENT OF THE INVENTION

The present invention is described in detail hereinafter with reference to the accompanying drawings.

Figure 1:
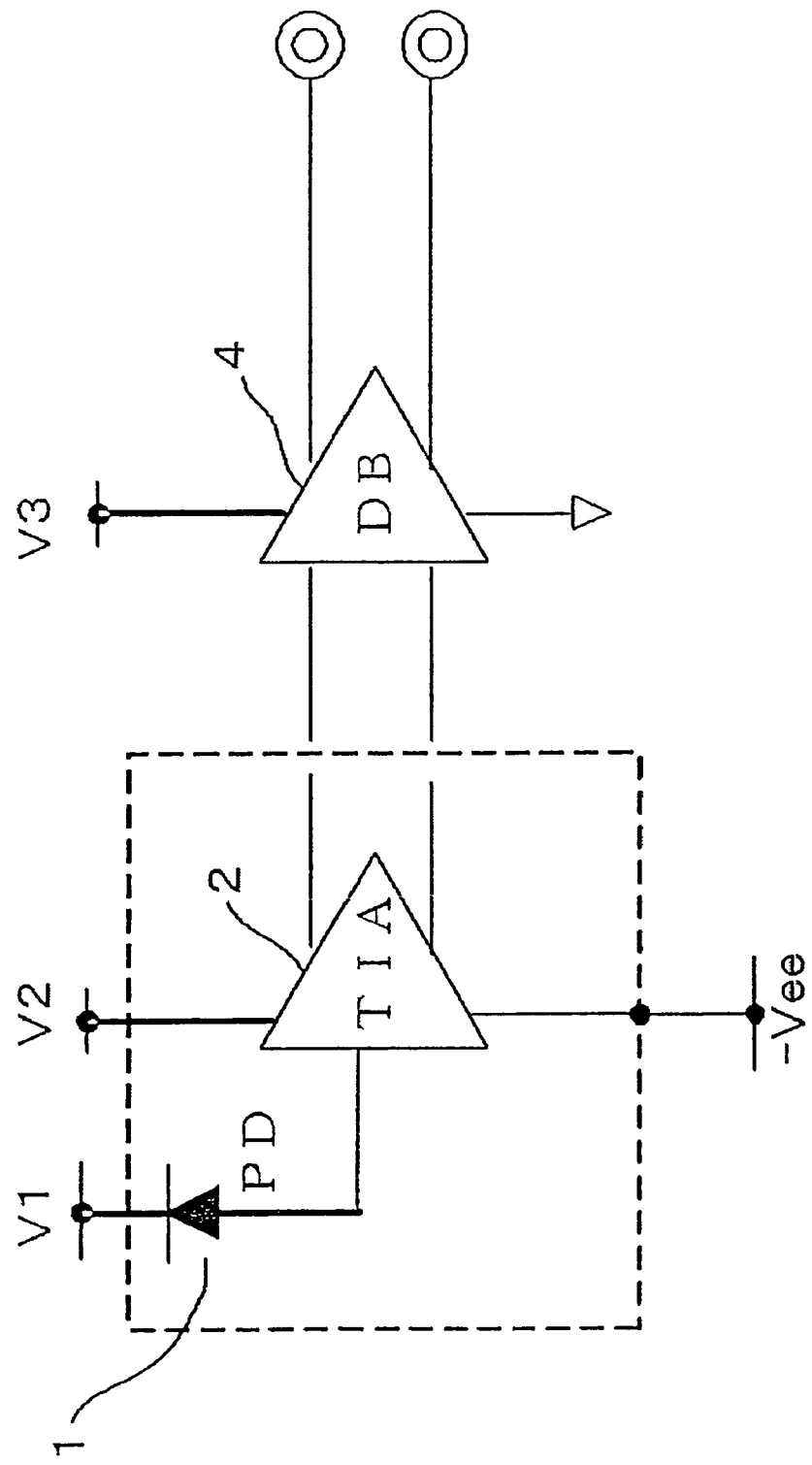
FIG. 1 is a circuit block diagram showing one embodiment of an optical communication module according to the invention.

FIG. 1 is a circuit block diagram showing principal parts of one embodiment of an optical communication module according to the invention, for use in an optical communication system.

In FIG. 1, a PD 1 has a cathode connected to a power source V1, and an anode connected to an input terminal of a TIA 2. Further, with the present invention, the PD 1 and the TIA 2, in a part surrounded by a dotted line in FIG. 1, are electrically insulated from an enclosure, and a negative voltage (bias: −Vee) is impressed on the PD 1 and the TIA 2. As the PD 1, a PIN diode excellent in frequency characteristics is preferably used.

The TIA 2 functions as a differential amplifier, having two output terminals directly connected to input terminals of a limiting amplifier 4. Differential outputs from the limiting amplifier 4 are also directly transmitted to a control circuit (not shown) disposed in a subsequent stage.

In a configuration as described above, an optical signal inputted is converted into an electric signal by the PD1 to be amplified by the TIA 2 in a subsequent stage. At this point in time, differential electric signals containing a DC component are generated at the TIA 2. The DC component is set off against the bias (−Vee) inputted to the TIA 2 before the differential electric signals are sent out to the limiting amplifier (DB) 4 in the subsequent stage.

The DB 4 amplifies AC outputs from the TIA 2, and compare the AC outputs as amplified with a predetermined threshold value, and outputting bit "1" when the optical signal is present while outputting bit "0" when no optical signal is present.

With the adoption of a configuration as described above, since no capacitor is provided, it is possible to maintain respective voltage levels and amplitudes of signals outputted from the TIA 2 at a fixed level even if the optical communication module is used in a system having variation in mark rate all the time, such as an optical packet communication system. Furthermore, because excess of an offset can be cancelled by adjusting Vee, it is possible to adequately provide the threshold value of the DB.

Assuming that an offset voltage generated at TIA is, for example, 1.7 V, and a voltage applied to V 1, V2, respectively, is 5 V, the offset voltage can be cancelled with Vee set to −3.3 V.

Figure 2:
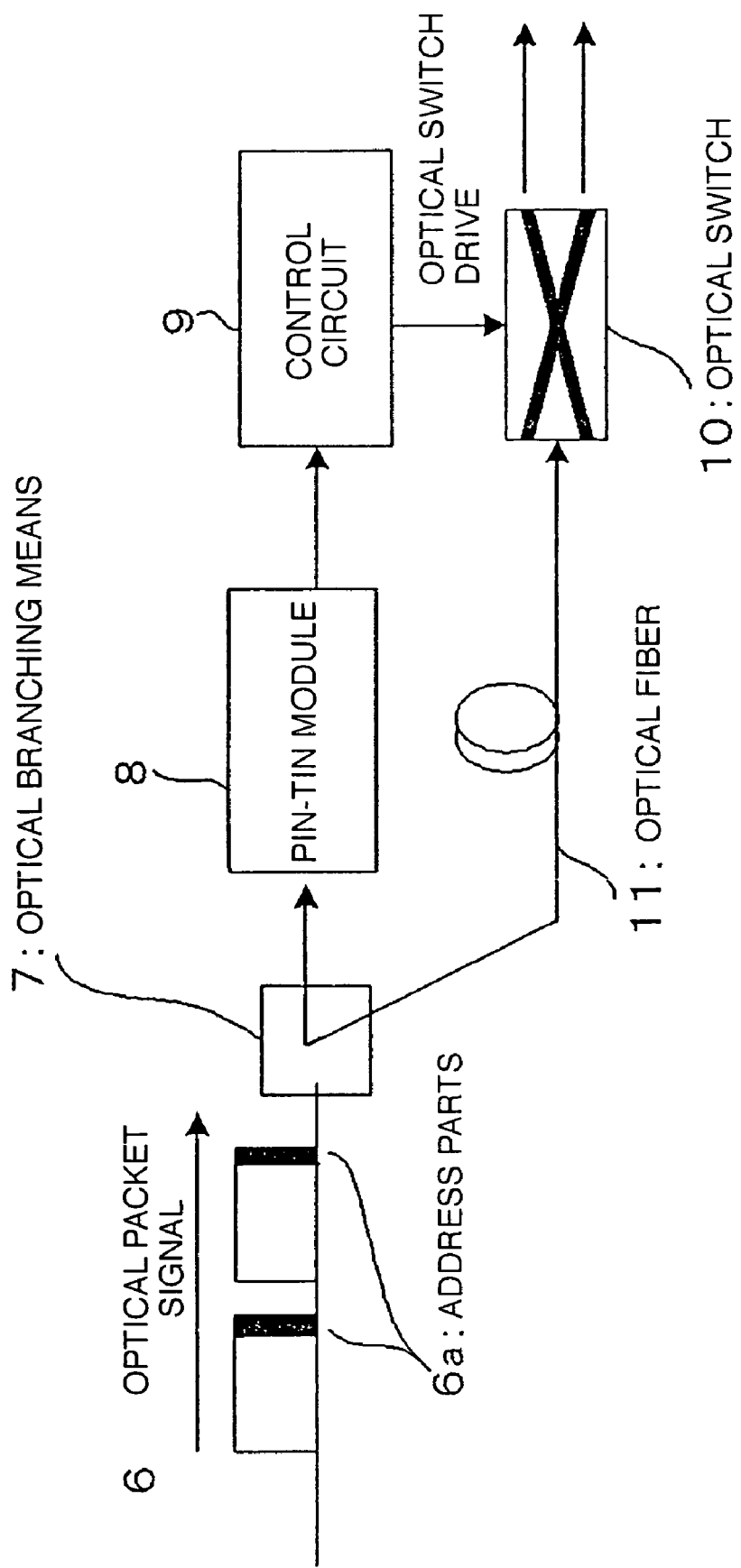
FIG. 2 is a block diagram showing an application example where the optical communication module according to the invention is put to use for recognition of an label of an optical packet switch.
Figure 3:
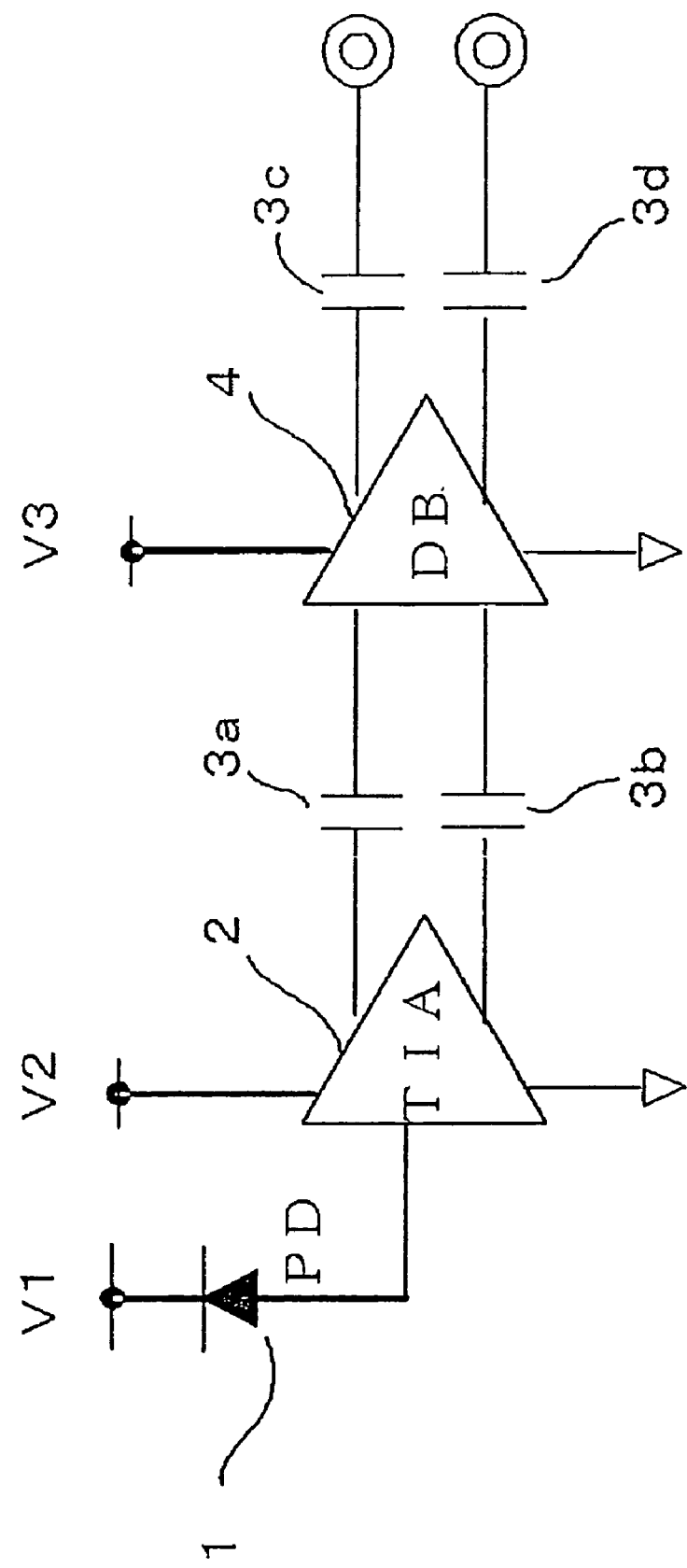
FIG. 3 is a circuit block diagram showing an example of a conventional optical communication module.

FIG. 2 shows an application example where the optical communication module described is put to use for detection of an address in an optical packet switch. In FIG. 2, reference numeral 6 denotes an optical packet signal having an identification part, or address part 6a at the header, 7 an optical branching means for bifurcating the optical packet signal 6, 8 the module or PIN-TIN module shown in FIG. 1, to which one of light rays as bifurcated by the optical branching means 7 is inputted.

Reference numeral 9 denotes a control circuit for determining respective destinations of the optical packet signals 6, and an output of the control circuit serves as a drive signal for an optical switch 10. The other of the light rays as bifurcated by the optical branching means 7 is subjected to buffering in a delay optical fiber 11, passing through the optical switch 10 at timing when path changeover is executed before being distributed to a destination as determined by the control circuit 9.

It is to be understood that the foregoing description relates to only a specific and preferred embodiment of the invention for explanation of the same by way of example. Hence, it will be appreciated that the invention is not limited thereto, and that various changes and modifications may be made in the invention without departing from the spirit and scope thereof.

What is claimed is:

1. An optical communication module comprising:
   a photoelectric converter for converting an optical signal into a current signal;
   a current/voltage conversion means connected to the photoelectric converter, for converting the current signal into a voltage signal;
   a negative voltage applied to the photoelectric converter and the current/voltage conversion means, thereby canceling an offset voltage occurring to an output signal from the current/voltage conversion means; and
   a limiting amplifier for receiving and amplifying an electric signal subjected to voltage conversion by the current/voltage conversion means while comparing the electric signal as amplified with a predetermined threshold value, thereby outputting a signal for "0" or "1".

2. An optical communication module according to claim 1, wherein the photoelectric converter and the current/voltage conversion means are electrically insulated from an enclosure.

* * * * *